United States Patent
Lee et al.

(10) Patent No.: US 10,296,114 B2
(45) Date of Patent: May 21, 2019

(54) TOUCH SCREEN DISPLAY APPARATUS AND METHOD OF MANUFACTURING THE SAME

(75) Inventors: Moon-Jae Lee, Yongin (KR); Won-Jun Song, Yongin (KR); Sun-Hee Lee, Yongin (KR); Young-Hee Lee, Yongin (KR); Mu-Hyun Kim, Yongin (KR); Hye-Dong Kim, Yongin (KR); Ji-Young Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1088 days.

(21) Appl. No.: 12/788,669

(22) Filed: May 27, 2010

(65) Prior Publication Data
US 2011/0043464 A1   Feb. 24, 2011

(30) Foreign Application Priority Data
Aug. 18, 2009 (KR) .......................... 10-2009-0076377

(51) Int. Cl.
*G06F 3/041* (2006.01)
*G06F 3/042* (2006.01)
*H01L 27/12* (2006.01)

(52) U.S. Cl.
CPC ............ *G06F 3/0412* (2013.01); *G06F 3/042* (2013.01); *G06F 2203/04103* (2013.01); *H01L 27/12* (2013.01)

(58) Field of Classification Search
CPC ........ G06F 3/042–3/0428; G06F 2203/04101; G06F 2203/04108; G06F 2203/04103; G06F 3/0412
See application file for complete search history.

(56) References Cited

U.S. PATENT DOCUMENTS

2003/0151702 A1* 8/2003 Morrison ................ G02F 1/135
                                                                    349/25
2004/0140960 A1* 7/2004 Cok ............................ 345/175
(Continued)

FOREIGN PATENT DOCUMENTS

KR   10-2008-0012594 A    2/2008
KR   10-2008-0107221      12/2008
(Continued)

OTHER PUBLICATIONS

Korean Registration Determination Certificate; corresponding Application Serial No. 10-2009-0076377; dated Sep. 29, 2011; 5 sheets.

*Primary Examiner* — David Tung
(74) *Attorney, Agent, or Firm* — Lewis Roca Rothgerber Christie LLP

(57) ABSTRACT

A touch screen display apparatus including a sensor unit to sense and to process light signals and a pixel unit to drive pixels according to the light signal processing performed by the sensor unit. The touch screen display apparatus includes a substrate; a plurality of pixel units disposed on the substrate, wherein each of the pixel units includes a first electrode, a second electrode, and an emission layer interposed between the first electrode and the second electrode; and a plurality of sensor units disposed on the substrate, wherein each of the sensor units includes a sensor first electrode, a sensor second electrode, and an organic light receiving layer interposed between the sensor first electrode and the sensor second electrode.

16 Claims, 5 Drawing Sheets

(56) References Cited

U.S. PATENT DOCUMENTS

| | | | | |
|---|---|---|---|---|
| 2004/0217928 | A1* | 11/2004 | Yamazaki et al. | 345/81 |
| 2005/0200293 | A1* | 9/2005 | Naugler, Jr. | G06F 3/03542 315/149 |
| 2006/0011913 | A1* | 1/2006 | Yamazaki | G06F 3/0412 257/59 |
| 2006/0146038 | A1* | 7/2006 | Park et al. | 345/173 |
| 2008/0150848 | A1* | 6/2008 | Chung | G06F 3/0412 345/82 |
| 2008/0303023 | A1* | 12/2008 | Choi | 257/59 |
| 2009/0256810 | A1* | 10/2009 | Pasquariello | G06F 3/0421 345/173 |
| 2009/0315840 | A1* | 12/2009 | Park et al. | 345/173 |

FOREIGN PATENT DOCUMENTS

| KR | 10-2009-0015698 | 2/2009 |
|---|---|---|
| KR | 10-2009-0036333 | 4/2009 |

* cited by examiner

TOUCH SCREEN DISPLAY APPARATUS AND METHOD OF MANUFACTURING THE SAME

CROSS-REFERENCE TO RELATED PATENT APPLICATION

This application claims the benefit of Korean Patent Application No. 10-2009-0076377, filed on Aug. 18, 2009, in the Korean Intellectual Property Office, the disclosure of which is incorporated herein in its entirety by reference.

BACKGROUND OF THE INVENTION

1. Field of the Invention

An aspect of the present invention relates to a touch screen display apparatus and a method of manufacturing the same, and more particularly, to a touch screen display apparatus including a photosensor that contains an organic material and a method of manufacturing the touch screen display apparatus.

2. Description of the Related Art

Photosensors, which convert light signals into electrical signals, are recently being developed to provide various functions due to developments in the photo industry and the semiconductor industry. Specifically, photosensors integrated in mobile apparatuses including display units, such as cellular phones, digital cameras, and personal digital assistants (PDAs), and image displaying apparatuses, such as liquid crystal displays (LCDs) and organic light emitting devices (OLEDs), are used as the most common form of adding a touch panel function to display units.

The photosensors integrated in display apparatuses have many advantages in solving the problems of external touch panels, such as increased thickness, complexity of manufacturing process, and reduction of aperture ratio. However, an amorphous silicon based or a crystalline silicon based P-I-N junction type transistor, which are generally used for photosensors integrated with display devices, have limitations in improving selected wavelength contrast sensitivity, and thus only light having wavelengths corresponding to the absorption wavelengths unique to the amorphous silicon or to the crystalline silicon may be used.

SUMMARY OF THE INVENTION

An aspect of the present invention provides a touch screen display apparatus including a photosensor, which is capable of selectively detecting lights of various wavelength bands, has excellent sensitivity, and may be manufactured using a simplified process, and a method of manufacturing the touch screen display apparatus.

According to an aspect of the present invention, there is provided a touch screen display apparatus including a sensor unit to sense and to process light signals and a pixel unit to drive pixels according to the light signal processing performed by the sensor unit, the touch screen display apparatus includes a substrate; a plurality of pixel units that are disposed on the substrate, wherein each of the pixel units includes a first electrode, a second electrode, and an emission layer interposed between the first electrode and the second electrode; and a plurality of sensor units that are disposed on the substrate, wherein each of the sensor units includes a sensor first electrode, a sensor second electrode, and an organic light receiving layer interposed between the sensor first electrode and the sensor second electrode.

According to another aspect of the present invention, the sensor first electrode may be formed of the same material as the first electrode of the pixel unit, and the sensor first electrode may be disposed on the same layer as the first electrode of the pixel unit.

According to another aspect of the present invention, the sensor second electrode may be formed of the same material as the second electrode of the pixel unit, and the sensor second electrode may be disposed on the same layer as the second electrode of the pixel unit.

According to another aspect of the present invention, the sensor units may be disposed between the plurality of pixel units.

According to another aspect of the present invention, the organic light receiving layer may be formed of a phthalocyanine compound containing one or more metals selected from the group consisting of Cu, Fe, Ni, Co, Mn, Al, Pd, Sn, In, Pb, Ti, Rb, V, Ga, Tb, Ce, La, and Zn.

According to another aspect of the present invention, the organic light receiving layer may be formed with a bi-layer consisting of a layer including a phthalocyanine compound containing one or more metals selected from the group consisting of Cu, Fe, Ni, Co, Mn, Al, Pd, Sn, In, Pb, Ti, Rb, V, Ga, Tb, Ce, La, Zn, and a layer including $C_{60}$.

According to another aspect of the present invention, the organic light receiving layer may be formed with a mixed layer, in which a phthalocyanine compound containing one or more metals selected from the group consisting of Cu, Fe, Ni, Co, Mn, Al, Pd, Sn, In, Pb, Ti, Rb, V, Ga, Tb, Ce, La, Zn, and $C_{60}$ are mixed.

According to another aspect of the present invention, the pixel unit may further include an intermediate layer including at least one among a hole injection layer (HIL), a hole transport layer (HTL), an electron transport layer (ETL), and an electron injection layer (EIL), and may be disposed between the first electrode and the second electrode.

According to another aspect of the present invention, the sensor unit may further include a sensor intermediate layer that is formed of the same material as the intermediate layer of the pixel unit and disposed between the sensor first electrode and the sensor second electrode.

According to another aspect of the present invention, at least one of the first electrode and the second electrode of the pixel unit may be a transparent electrode.

According to another aspect of the present invention, a pixel defining layer that is formed around the first electrode of the pixel units may be disposed between the plurality of pixel units, and the pixel defining layer may also be disposed between the sensor units and the pixel units.

According to another aspect of the present invention, there is provided a method of manufacturing a touch screen display apparatus that includes a sensor unit to sense and to process light signals and a pixel unit to select pixels according to the light signal processing performed by the sensor unit, the method including forming a first electrode of the pixel unit and a sensor first electrode of the sensor unit on a substrate; forming an emission layer of the pixel unit and an organic light receiving layer of the sensor unit on the first electrode and the sensor first electrode, respectively; and forming a second electrode of the pixel unit and a sensor second electrode of the sensor unit on the emission layer and the organic light receiving layer, respectively.

According to another aspect of the present invention, the first electrode of the pixel unit and the sensor first electrode of the sensor unit may be simultaneously formed of the same material.

According to another aspect of the present invention, the second electrode of the pixel unit and the sensor second electrode of the sensor unit may be simultaneously formed of the same material.

According to another aspect of the present invention, the forming of the emission layer of the pixel unit and the organic light receiving layer of the sensor unit on the first electrode and the sensor first electrode may further include forming an intermediate layer that includes at least one among an HIL (hole injection layer), an HTL (hole transport layer), an ETL (electron transport layer), and an EIL (electron injection layer), in the pixel unit.

According to another aspect of the present invention, the forming of the emission layer of the pixel unit and the organic light receiving layer of the sensor unit on the first electrode and the sensor first electrode may further include forming a sensor intermediate layer that is formed of the same material as the intermediate layer of the pixel unit, in the sensor unit.

According to another aspect of the present invention, the sensor intermediate layer and the intermediate layer of the pixel unit may be simultaneously formed.

According to another aspect of the present invention, the method may further include forming a pixel defining layer around the first electrode of the pixel unit after forming the first electrode of the pixel unit and the sensor first electrode of the sensor unit on the substrate.

According to another aspect of the present invention, the method may further include forming a pixel defining layer between the sensor unit and the pixel unit.

According to another aspect of the present invention, the at least one of the first electrode and the second electrode of the pixel unit may be a transparent electrode.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other features and advantages of the present invention will become more apparent by describing in detail exemplary embodiments thereof with reference to the attached drawings in which.

DETAILED DESCRIPTION OF THE INVENTION

Figure 1:
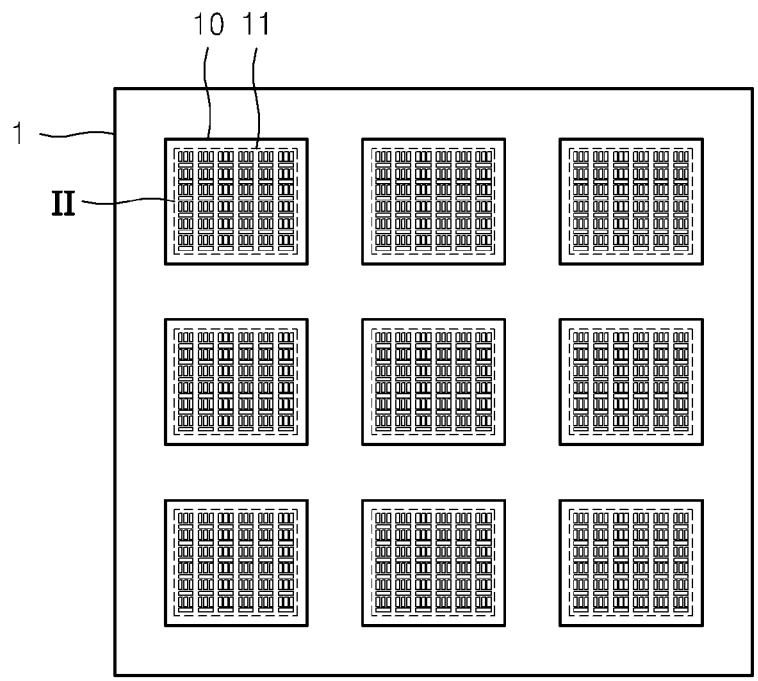
FIG. 1 is a plan view of a mother glass that includes a plurality of touch screen display apparatuses according to an embodiment of the present invention.

Reference will now be made in detail to the present embodiments of the present invention, examples of which are illustrated in the accompanying drawings, wherein like reference numerals refer to the like elements throughout.

The embodiments are described below in order to explain the present invention by referring to the figures.

Here, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

FIG. 1 is a plan view of a mother glass that includes a plurality of touch screen display apparatuses according to an embodiment of the present invention. Referring to FIG. 1, a plurality of touch screen display apparatuses 10 is disposed on a single mother glass 1. Each of the touch screen display apparatuses 10 includes a display unit 11 that includes a plurality of pixel units P and sensor units S that are described below.

Figure 2:
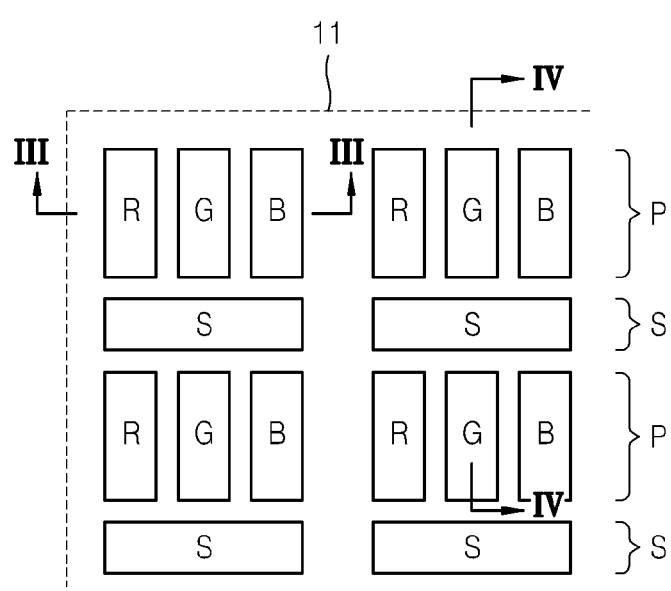
FIG. 2 is a plan view showing Section II of FIG. 1 in closer detail.

FIG. 2 is a diagram schematically showing the display unit 11 located in the interior of the touch screen display apparatus 10 according to an embodiment of the present invention, which is a plan view showing Section II of FIG. 1 in closer detail. Referring to FIG. 2, the touch screen display apparatus 10 according to an embodiment of the present invention includes the display unit 11 disposed on a substrate 20 and includes a plurality of the pixel units P and a plurality of the sensor units S.

Although it is shown that each of the plurality of pixel units P includes three sub-pixels R, G, and B arranged in a straight line, the aspects of the present invention are not limited thereto. That is, types, sizes, and arrangement of sub-pixels constituting each of the pixel units P may vary.

Furthermore, although it is shown that a plurality of the sensor units S are disposed between the pixel units P, such is merely an embodiment of the aspects of the present invention, and therefore, the aspects of the present invention are not limited thereto. In other words, as long as the sensor units S are disposed between the pixel units P, locations of each of the sensor units S may vary, e.g., the sensor units S may be located between every two or three of the pixel units P.

Figure 3:
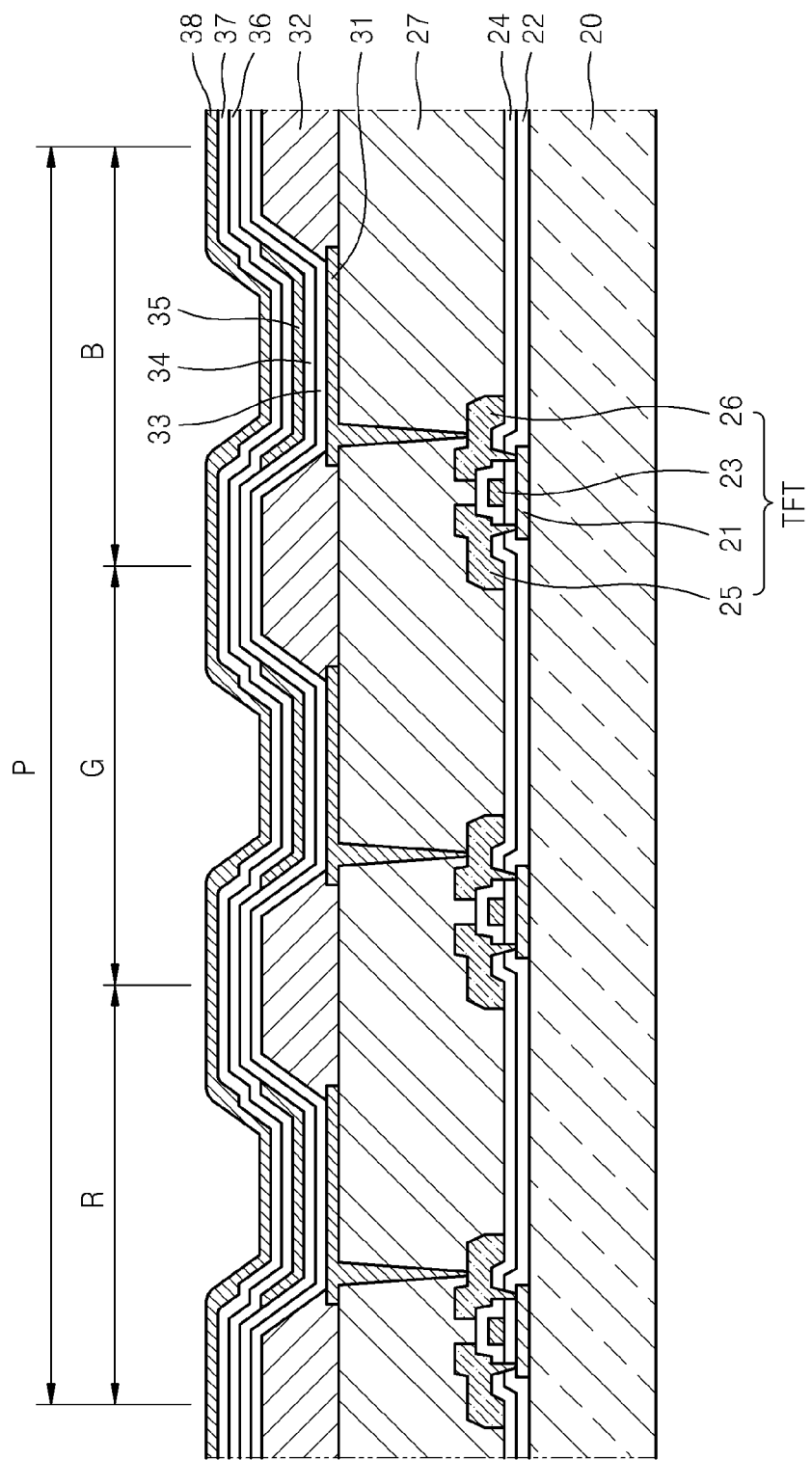
FIG. 3 is a sectional view taken along a line III-III of FIG. 2.

FIG. 3 is a sectional view taken along a line III-III of the display unit 11 of FIG. 2, having depicted therein an active matrix (AM) type organic light emitting display (OLED) apparatus in which three sub-pixels R, G, and B of one of the pixel units P of FIG. 2 are disposed on the substrate 20. Each of the sub-pixels R, G, and B that are shown in FIG. 3 includes at least one thin-film transistor (TFT). However, the TFT, which is used in aspects of the present invention, is not limited to that as shown in FIG. 3, and the TFT may have another structure and/or various numbers of the TFT may be used. Such an AM type OLED apparatus is described below in detail.

The substrate 20 may be an insulation substrate formed of a transparent glass material mainly comprising $SiO_2$, a plastic substrate, or a quartz substrate. Meanwhile, although it is not shown in FIG. 3, a buffer layer (not shown) formed of $SiO_2$ and/or $SiN_X$ may be formed on the substrate 20 for planarizing the substrate 20 and preventing diffusion of impurities.

A TFT is disposed on the substrate 20. The TFT includes a semiconductor active layer 21, a gate insulation layer 22 formed to cover the active layer 21, and a gate electrode 23 formed on the gate insulation layer 22. An interlayer insulation layer 24 is formed to cover the gate electrode 23, and a source electrode 25 and a drain electrode 26 are formed on the interlayer insulation layer 24. The source electrode 25 and the drain electrode 26 are respectively connected to a source region and a drain region of the active layer 21 via contact holes formed through the gate insulation layer 22 and the interlayer insulation layer 24.

A first electrode 31 of the pixel units P is formed on a planarizing layer 27 and is connected to the source electrode 25 and the drain electrode 26 via a via hole. Furthermore, a pixel defining layer 32 is formed to cover the first electrode 31. After a predetermined opening is formed in the pixel defining layer 32, an intermediate layer 33, 34, 36, and 37 including an emission layer (EML) 35 is formed, and a second electrode 38 is deposited thereon as a common electrode.

Here, the first electrode 31 is used as an anode electrode, whereas the second electrode 38 is used as a cathode electrode. However, the first electrode 31 may be used as the cathode electrode and the second electrode 38 may be used as the anode electrode.

The first electrode 31 may be a reflective electrode, and may be formed by forming a reflective layer using Ag, Mg, Al, Pt, Pd, Au, Ni, Nd, Ir, Cr, or a compound thereof and forming ITO, IZO, ZnO, or $In_2O_3$ thereon.

Meanwhile, the second electrode 38 may be a transparent electrode. When the second electrode 38 is used as a cathode electrode, a metal with relatively low work function, e.g., Ca, LiF/Ca, LiF/Al, Al, Ag, Mg, or a compound thereof, is deposited to face the EML 35, and an assistant electrode layer or a bus electrode line may be formed on the deposited metal using a material for forming a transparent electrode, such as ITO, IZO, ZnO, or $In_2O_3$.

The intermediate layer including the EML 35 may be formed of organic monomer layers or organic polymer layers. When using organic monomer layers, the intermediate layer may be formed by stacking at least one from among a hole injection layer (HIL) 33, a hole transport layer (HTL) 34, the EML 35, an electron transport layer (ETL) 36, and an electron injection layer (EIL) 37 in a single structure or in a composite structure of organic materials. Various organic materials, such as copper phthalocyanine (CuPc), N,N-di(naphthalene-1-yl)-N,N'-diphenyl-benzidine (NPB), and tris-8-hydroxyquinoline aluminum (Alq3), may be used to form the structures. The organic monomer layers are formed by using a vacuum deposition method.

Although FIG. 3 shows a case in which organic monomer layers are used, the aspects of the present invention are not limited thereto. In other words, when the intermediate layer is formed of organic polymer layers, the intermediate layer may have a structure in which an HTL and an EML are stacked. Here, the HTL may be formed of Poly(3,4-ethylenedioxythiophene) PEDOT, whereas the EML may be formed of an organic polymer material, such as a polyphenylenevinylene(PPV)-based material or a polyfluorene-based material. The HTL and the EML may be formed by using a screen printing method, inkjet printing method, or a laser induced thermal imaging (LITI) method, for example.

Furthermore, although it is shown that the thickness of the EML 35 for each of the sub-pixels R, G, and B is the same, the aspects of the present invention are not limited thereto. In other words, the EMLs 35 of the sub-pixels R, G, and B may have different thicknesses or may further include sub-EMLs to adapt to a resonant structure.

Figure 4:
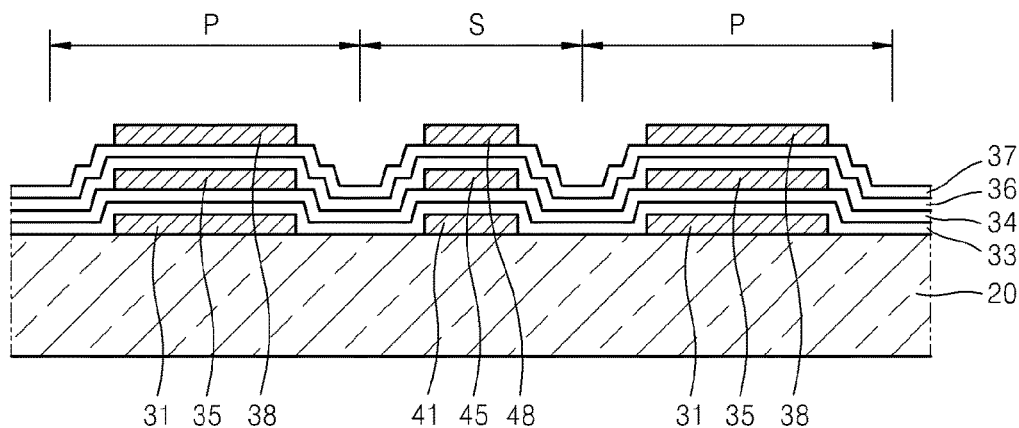
FIG. 4 is a sectional view taken along line IV-IV of FIG. 2.

FIG. 4 is a sectional view taken along line IV-IV of FIG. 2 showing two of the pixel units P and one of the sensor units of FIG. 2, where the one of the sensor units S is disposed between the two of the pixel units P on the substrate 20.

Although not shown, TFTs, connected to the pixel units P, and a sensor TFT, connected to the sensor units S and processing sensor signals, may be further disposed on the substrate 20.

The sensor units S include at least a sensor first electrode 41, an organic light receiving layer 45, and a sensor second electrode 48.

The sensor first electrode 41 is formed of the same material as the first electrode 31 of the pixel units P. In other words, in cases where the first electrode 31 of the pixel units P is a reflective electrode, the sensor first electrode 41 may also be a reflective electrode. For example, the sensor first electrode 41 may be formed by forming a reflective layer using Ag, Mg, Al, Pt, Pd, Au, Ni, Nd, Ir, Cr, or a compound thereof and forming ITO, IZO, ZnO, or $In_2O_3$ thereon. Furthermore, the sensor first electrode 41 is formed on the same layer as the first electrode 31 of the pixel units P. To form the sensor first electrode 41 on the same layer as the first electrode 31 of the pixel units P, the first electrode 31 of the pixel units P and the sensor first electrode 41 of the sensor units S are simultaneously patterned by using the same deposition material and a mask (not shown) including predetermined patterns corresponding to patterns of the first electrode 31 and the sensor first electrode 41.

The organic light receiving layer 45 is formed of a phthalocyanine compound containing one or more metals selected from the group consisting of Cu, Fe, Ni, Co, Mn, Al, Pd, Sn, In, Pb, Ti, Rb, V, Ga, Tb, Ce, La, and Zn.

Meanwhile, the organic light receiving layer 45 may be formed with either a bi-layer consisting of a layer including a phthalocyanine compound containing one or more metals selected from the group consisting of Cu, Fe, Ni, Co, Mn, Al, Pd, Sn, In, Pb, Ti, Rb, V, Ga, Tb, Ce, La, and Zn and a layer including $C_{60}$, or may be formed with a mixed layer in which a phthalocyanine compound and $C_{60}$ are mixed.

The sensor second electrode 48 is formed of the same material as the second electrode 38 of the pixel units P. In other words, where the second electrode 38 of the pixel units P is a reflective electrode, the sensor second electrode 48 may also be a reflective electrode. For example, Ca, LiF/Ca, LiF/Al, Al, Ag, Mg, or a compound thereof may be deposited to face the organic light receiving layer 45, and a material for forming a transparent electrode, such as ITO, IZO, ZnO, or $In_2O_3$, may be formed thereon. Furthermore, the sensor second electrode 48 is formed on the same layer as the second electrode 38 of the pixel units P. To form the sensor second electrode 48 on the same layer as the second electrode 38 of the pixel units P, the second electrode 38 of the pixel units P and the sensor second electrode 48 of the sensor units S are simultaneously patterned by using the same deposition material and a mask (not shown) including predetermined patterns corresponding to patterns of the second electrode 38 and the sensor second electrode 48.

Meanwhile, when using organic monomer layers, the HIL 33 and the HTL 34 are further disposed between the sensor first electrode 41 and the organic light receiving layer 45, and the ETL 36 and the EIL 37 are further disposed between the organic light receiving layer 45 and the sensor second electrode 48. Such layers are sequentially formed as a sensor intermediate layer using the same material as the intermediate layer of the pixel units P.

Furthermore, although not shown, an HTL may also be disposed between the sensor second electrode 41 and the organic light receiving layer 45, when using organic polymer layers.

Meanwhile, although it is shown that the intermediate layer of the pixel units P and the sensor intermediate layer are formed as a common layer without distinguishing the pixel units P and the sensor units S, the aspects of the present invention are not limited thereto. In other words, the patterns of the intermediate layer of the pixel units P and the sensor intermediate layer may only be formed on the pixel units P and the sensor units S, respectively. However, in any case, the intermediate layer of the pixel units P and the sensor intermediate layer are simultaneously formed of the same material. For example, in cases of using an organic monomer material, the intermediate layer of the pixel units P and the sensor intermediate layer may be simultaneously deposited by using a mask (not shown) having predetermined patterns. When using an organic polymer material, the intermediate layer of the pixel units P and the sensor intermediate layer may be simultaneously patterned in the same screening process, the same printing process, or the same LITI process.

Furthermore, although not shown, the pixel defining layer 32, which is disposed between the pixel units P of FIG. 3, may further be disposed between the sensor units S and the pixel units P of a touch screen display apparatus according to an aspect of the present invention.

Furthermore, various structures may further be disposed between the sensor units S and the pixel units P of a touch screen display apparatus according to an aspect of the present invention, e.g., a blocking wall (not shown) to block internal light (light emitted by an emission unit of the touch screen display apparatus) that may be noise to the sensor units S.

As described above, the light detection band of a photosensor of the sensor units S may be determined by controlling metal ingredients contained in the phthalocyanine compound of the organic light receiving layer 45. For example, visible light in a wavelength range from about 600 nm to about 800 nm is absorbed when using a phthalocyanine compound containing Cu, whereas near-infrared light in a wavelength range from about 800 nm to about 1000 nm is absorbed when using a phthalocyanine compound containing Sn. Thus, a photosensor for detecting light in a desired wavelength range may be formed by selecting a corresponding metal to be contained in the phthalocyanine compound.

Furthermore, since the sensor units S are formed on a layer on which pixels are formed instead of a layer on which TFTs of an organic light emitting device are formed, deterioration of an organic light receiving layer that may occur during fabrication of TFTs may be prevented.

Furthermore, since the materials and the processes for forming the sensor first electrode 41, the sensor second electrode 48, and the sensor intermediate layer may also be applied to formation of the sensor unit S, the process of forming the sensor units S may be simplified, and materials and costs for forming the sensor units S may be reduced.

Hereinafter, a method of manufacturing a touch screen display apparatus according to an embodiment of the present invention will be described in reference to FIGS. 5 through 10.

Figure 5:
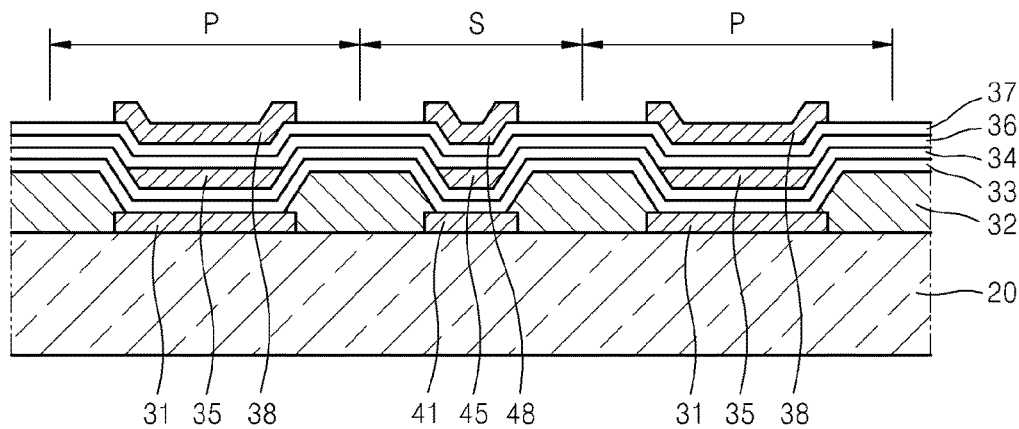
FIG. 5 is a sectional view of a modification of the structure shown in FIG. 4.
Figure 6:
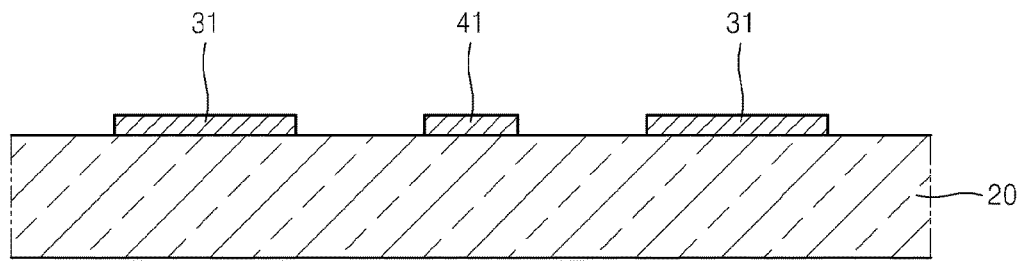
FIGS. 6 through 11 are sectional views showing a method of manufacturing a touch screen display apparatus including a photosensor according to an embodiment of the present invention.

First, referring to FIGS. 5 and 6, and in particular to FIG. 6, the first electrode 31 of the pixel units P and the sensor first electrode 41 of the sensor units S are formed on the substrate 20, wherein the first electrode 31 and the sensor first electrode 41 are simultaneously formed on the same layer, using the same material. As described above, the first electrode 31 of the pixel units P and the sensor first electrode 41 of the sensor units S are simultaneously patterned by using the same deposition material and a mask (not shown) including predetermined patterns corresponding to patterns of the first electrode 31 and the sensor first electrode 41.

Figure 7:
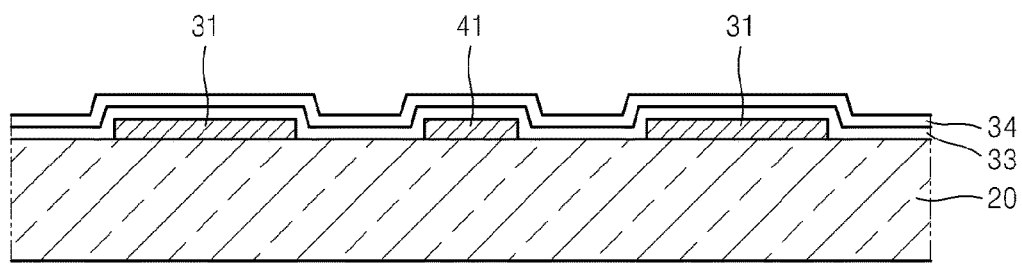

Referring to FIG. 7, the HIL 33 and the HTL 34 are sequentially formed on the first electrode 31 of the pixel units P and the sensor first electrode 41 of the sensor units S as common layers. Here, FIG. 7 shows a case of using organic monomer layers. Thus, when using organic polymer layers, only an HTL needs to be disposed.

Furthermore, although it is shown that the intermediate layer of the pixel units P and the sensor intermediate layer are formed as a common layer without distinguishing the pixel units P and the sensor units S, the patterns of the intermediate layer of the pixel units P and the sensor intermediate layer may only be formed on the pixel units P and the sensor units S, respectively, as described above. However, the HIL 33 and the HTL 34 are sequentially patterned on the pixel units P and the sensor units S by using the same process and the same material.

Figure 8:
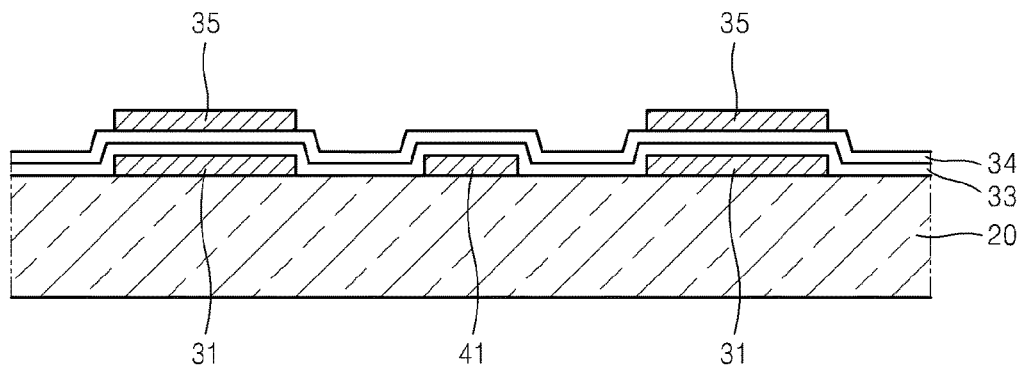

Referring to FIG. 8, the EML 35 is formed on each of the pixel units P. FIG. 8 shows a case where the EML 35 is formed of an organic monomer material as described above, and the EML 35 may be formed by using a vacuum deposition method.

Figure 9:
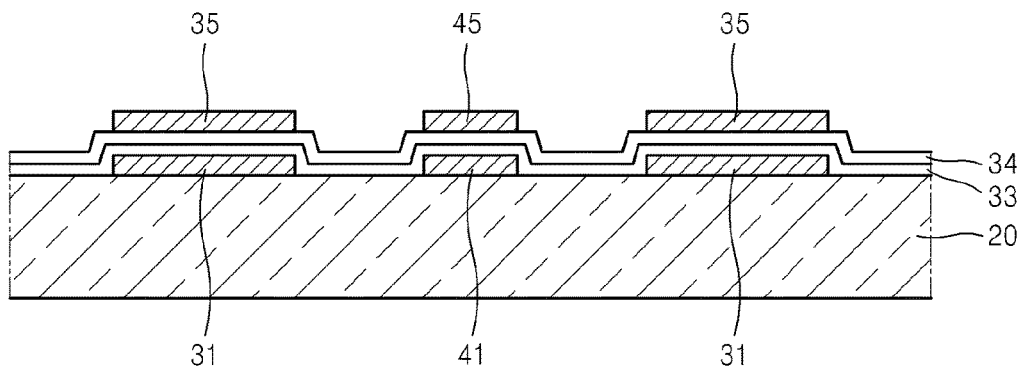

Referring to FIG. 9, the organic light receiving layer 45 is formed on each of the sensor units S. The organic light receiving layer 45 may be formed of a phthalocyanine compound containing a metal, and may be formed by using the same vacuum deposition method as the process of depositing the organic monomer material.

Although the EML 35 of the pixel units P is formed first and the organic light receiving layer 45 of the sensor units S is formed later in FIGS. 8 and 9, the sequence may be reversed.

Figure 10:
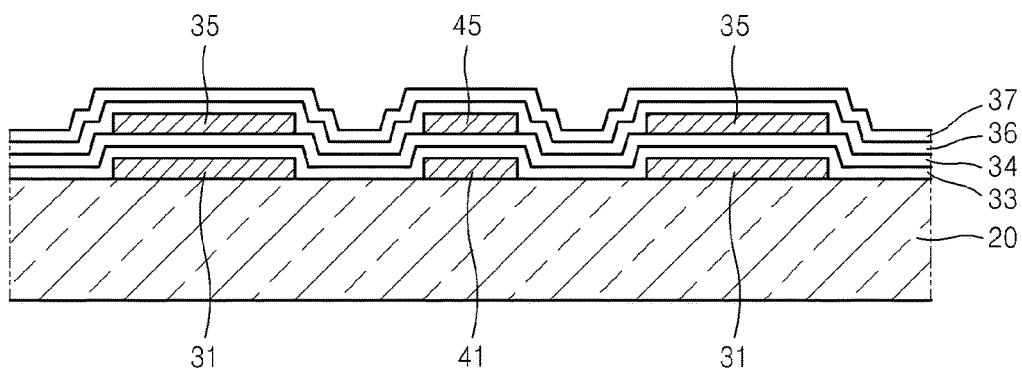

Referring to FIG. 10, the ETL 36 and the EIL 37 are sequentially formed on the EML 35 of the pixel units P and the organic light receiving layer 45 of the sensor units S as common layers. Here, FIG. 10 shows a case of using organic monomer layers. Thus, when using organic polymer layers, another organic layer may be disposed or no organic layer may be disposed.

Furthermore, although it is shown that the intermediate layer of the pixel units P and the sensor intermediate layer are formed as a common layer without distinguishing the pixel units P and the sensor units S, the patterns of the intermediate layer of the pixel units P and the sensor intermediate layer may only be formed on the pixel units P and the sensor units S, respectively, as described above. However, the ETL 36 and the EIL 37 are simultaneously patterned on the pixel units P and the sensor units S by using the same process and the same material.

Figure 11:
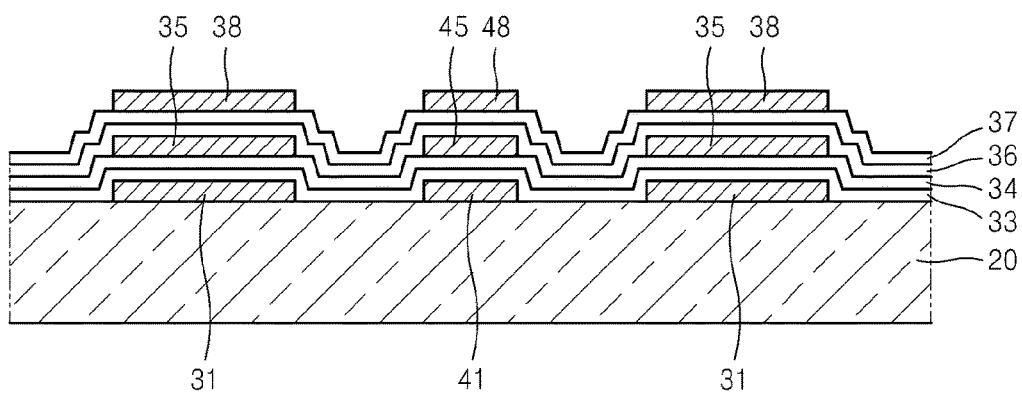

Referring to FIG. 11, the second electrode 38 of the pixel units P and the sensor second electrode 48 of the sensor units S are formed on the structure of the EIL layer 37 of FIG. 9, wherein the second electrode 38 of the pixel units P and the sensor second electrode 48 of the sensor units S are simultaneously formed on the same layer, using the same material. As described above, the second electrode 38 of the pixel units P and the sensor second electrode 48 of the sensor units S are simultaneously patterned by using the same deposition material and a mask (not shown) including predetermined patterns corresponding to patterns of the second electrode 38 and sensor second electrode 48.

As described above, according to a method of manufacturing a touch screen display apparatus according to an embodiment of the present invention, sensor units are formed on a layer on which pixels are formed instead of a layer on which TFTs of an organic light emitting device are formed, and thus deterioration of an organic light receiving layer that may occur during fabrication of TFTs may be prevented. Furthermore, since the materials and the processes for forming a sensor first electrode, a sensor second electrode, and a sensor intermediate layer may also be applied to formation of a sensor unit, a process of forming the sensor units S may be simplified, and materials and costs for forming the sensor units S may be saved.

Meanwhile, the aspects of the present invention are not limited to a display apparatus including the photosensor and the TFT shown in the drawings. That is, any type of photosensors and any type of TFTs may be combined and disposed in a display apparatus according to the aspects of the present invention.

While the aspects of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A touch screen display apparatus comprising:
a substrate;
a plurality of sensor units on the substrate and configured to sense and to process light signals, wherein each of the sensor units comprises a sensor first electrode, a sensor second electrode, and an organic light receiving layer interposed between the sensor first electrode and the sensor second electrode;
a plurality of pixel units on the substrate and configured to drive pixels according to the light signal processing performed by the sensor units, wherein each of the pixel units comprises a first electrode, a second electrode, and an emission layer interposed between the first electrode and the second electrode, wherein each of the first electrodes and the sensor first electrodes are disposed directly on a same first layer, and wherein the second electrode is disposed to be connected to each of the pixel units in common;
a blocking wall between the sensor units and the pixel units and configured to block light emitted by the emission layer; and
a plurality of transistors interposed between the substrate and the first layer,
wherein each of the plurality of pixel units is arranged in a first direction, and comprises a first sub-pixel emitting a first color, a second sub-pixel emitting a second color different from the first color, and a third sub-pixel emitting a third color different from the first and second colors,
wherein each of the plurality of sensor units is arranged between a pair of sub-pixels along a second direction perpendicular to the first direction, and arranged across the first to third sub-pixels along the first direction, the pair of sub-pixels being adjacent to each other and emitting the same color,
wherein the sensor first electrode of the sensor unit is disposed directly on the same first layer from a first side of the sensor first electrode to a second side of the sensor first electrode,
wherein the organic light receiving layer comprises a different material from the emission layer, and the organic light receiving layer comprises $C_{60}$ and a phthalocyanine compound containing one or more metals selected from the group consisting of Cu, Fe, Ni, Co, Mn, Al, Pd, Sn, In, Pb, Ti, Rb, V, Ga, Tb, Ce, La, and Zn, and wherein the organic light receiving layer and the emission layer are disposed directly on a same second layer, the same second layer entirely separating the sensor first electrode and the organic light receiving layer and extending continuously between the organic light receiving layer and the emission layer in the second direction.

2. The touch screen display apparatus of claim 1, wherein the sensor first electrode is of a same material as the first electrode of each of the pixel units.

3. The touch screen display apparatus of claim 1, wherein the sensor second electrode is of a same material as the second electrode of each of the pixel units, and the sensor second electrode is disposed on a same third layer as the second electrode of each of the pixel units.

4. The touch screen display apparatus of claim 1, wherein the plurality of sensor units are disposed between the plurality of pixel units.

5. The touch screen display apparatus of claim 1, wherein the organic light receiving layer is a bi-layer consisting of a layer including the phthalocyanine compound containing one or more metals selected from the group consisting of Cu, Fe, Ni, Co, Mn, Al, Pd, Sn, In, Pb, Ti, Rb, V, Ga, Tb, Ce, La, and Zn, and a layer including $C_{60}$.

6. The touch screen display apparatus of claim 1, wherein the organic light receiving layer is a mixed layer, in which the phthalocyanine compound containing one or more metals selected from the group consisting of Cu, Fe, Ni, Co, Mn, Al, Pd, Sn, In, Pb, Ti, Rb, V, Ga, Tb, Ce, La, and Zn, and $C_{60}$ are mixed.

7. The touch screen display apparatus of claim 1, wherein at least one of the first electrode and the second electrode of each of the pixel units is a transparent electrode.

8. The touch screen display apparatus of claim 1, wherein a pixel defining layer is formed around the first electrode of each of the pixel units, and the pixel defining layer is also disposed between the sensor units and each of the pixel units.

9. A touch screen display apparatus comprising:
a substrate;
a plurality of sensor units on the substrate and configured to sense and to process light signals, wherein each of the sensor units comprises a sensor first electrode, a sensor second electrode, and an organic light receiving layer interposed between the sensor first electrode and the sensor second electrode;
a plurality of pixel units on the substrate and configured to drive pixels according to the light signal processing performed by the sensor units, wherein each of the pixel units comprises a first electrode, a second electrode, and an emission layer interposed between the first electrode and the second electrode, wherein each of the first electrodes and the sensor first electrodes are disposed directly on a same first layer, and wherein the second electrode is disposed to be connected to each of the pixel units in common;
a blocking wall between the sensor units and the pixel units and configured to block light emitted by the emission layer; and
a plurality of transistors interposed between the substrate and the first layer,
wherein each of the plurality of pixel units is arranged in a first direction, and comprises a first sub-pixel emitting a first color, a second sub-pixel emitting a second color different from the first color, and a third sub-pixel emitting a third color different from the first and second colors, wherein each of the plurality of sensor units is arranged between a pair of sub-pixels along a second direction perpendicular to the first direction, and arranged across the first to third sub-pixels along the first direction, the pair of sub-pixels being adjacent to each other and emitting the same color, wherein the sensor first electrode of the sensor unit is disposed directly on the same first layer from a first side of the sensor first electrode to a second side of the sensor first electrode, wherein each of the pixel units further comprises an intermediate layer including at least one among a hole injection layer (HIL), a hole transport layer (HTL), an electron transport layer (ETL), and an electron injection layer (EIL), and disposed between the first electrode and the second electrode, wherein the sensor first electrode is of a same material as the first electrode of each of the pixel units, wherein the sensor second electrode is of a same material as the second electrode of each of the pixel units, and the sensor second electrode is disposed on a same layer as the second electrode of each of the pixel units, wherein each of the sensor units further comprises a sensor intermediate layer of a same material as the intermediate layer of each of the pixel units and disposed between the sensor first electrode and the sensor second electrode, and wherein the organic light receiving layer comprises a different material from the emission layer, and the organic light receiving layer comprises $C_{60}$ and a phthalocyanine compound containing one or more metals selected from the group consisting of Cu, Fe, Ni, Co, Mn, Al, Pd, Sn, In, Pb, Ti, Rb, V, Ga, Tb, Ce, La, and Zn, and wherein the organic light receiving layer and the emission layer are disposed directly on a same second layer, the same second layer entirely separating the sensor first electrode and the organic light receiving layer and extending continuously between the organic light receiving layer and the emission layer in the second direction.

10. A method of manufacturing a touch screen display apparatus comprising a sensor unit to sense and process light signals, a pixel unit to select pixels according to the light signal processing performed by the sensor unit, and a plurality of transistors, the method comprising:

forming the plurality of transistors on a substrate;

simultaneously forming a first electrode of the pixel unit and a sensor first electrode of the sensor unit directly on a same first layer, the plurality of transistors being interposed between the substrate and the first layer;

forming an emission layer of the pixel unit on the first electrode and the sensor first electrode;

forming an organic light receiving layer of the sensor unit on the sensor first electrode before or after the forming the emission layer, wherein the organic light receiving layer and the emission layer are formed directly on a same second layer, the same second layer entirely separating the sensor first electrode and the organic light receiving layer and extending continuously between the organic light receiving layer and the emission layer in the second direction, wherein the organic light receiving layer comprises a different material from the emission layer, and the organic light receiving layer comprises $C_{60}$ and a phthalocyanine compound containing one or more metals selected from the group consisting of Cu, Fe, Ni, Co, Mn, Al, Pd, Sn, In, Pb, Ti, Rb, V, Ga, Tb, Ce, La, and Zn;

simultaneously forming a second electrode of the pixel unit and a sensor second electrode of the sensor unit on the emission layer and the organic light receiving layer, respectively, and wherein the second electrode is disposed to be connected to each of a plurality of pixel units including the pixel unit in common; and forming a blocking wall between a plurality of sensor units including the sensor unit and the pixel units and configured to block light emitted by the emission layer, wherein each of the plurality of pixel units is arranged in a first direction, and comprises a first sub-pixel emitting a first color, a second sub-pixel emitting a second color different from the first color, and a third sub-pixel emitting a third color different from the first and second colors, wherein each of the plurality of sensor units is arranged between a pair of sub-pixels along a second direction perpendicular to the first direction, and arranged across the first to third sub-pixels along the first direction, the pair of sub-pixels being adjacent to each other and emitting the same color, and wherein the sensor first electrode of the sensor unit is disposed directly on the same first layer from a first side of the sensor first electrode to a second side of the sensor first electrode.

11. The method of claim 10, wherein the first electrode of the pixel unit and the sensor first electrode of the sensor unit are simultaneously formed of a same material.

12. The method of claim 11, further comprising forming a pixel defining layer between the sensor unit and the pixel unit.

13. The method of claim 10, wherein the second electrode of the pixel unit and the sensor second electrode of the sensor unit are simultaneously formed of a same material.

14. The method of claim 10, wherein the forming of the emission layer further comprises forming an intermediate layer that includes at least one among an HIL (hole injection layer), an HTL (hole transport layer), an ETL (electron transport layer), and an EIL (electron injection layer), in the pixel unit, and the forming of the organic light receiving layer further comprises forming a sensor intermediate layer that is formed of a same material as the intermediate layer of the pixel unit, in the sensor unit, wherein the sensor intermediate layer and the intermediate layer are simultaneously formed.

15. The method of claim 10, further comprising forming a pixel defining layer around the first electrode of the pixel unit after forming the first electrode and the sensor first electrode.

16. The method of claim 10, wherein at least one of the first electrode and the second electrode of the pixel unit is a transparent electrode.

* * * * *